(12) United States Patent
Liu et al.

(10) Patent No.: US 10,700,121 B2
(45) Date of Patent: Jun. 30, 2020

(54) INTEGRATED MULTILAYER MONOLITHIC ASSEMBLY LED DISPLAYS AND METHOD OF MAKING THEREOF

(71) Applicant: SCT TECHNOLOGY, LTD., Grand Cayman (KY)

(72) Inventors: Heng Liu, Milpitas, CA (US); Eric Li, Milpitas, CA (US); Ray-Hua Horng, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 0 days.

(21) Appl. No.: 15/895,769

(22) Filed: Feb. 13, 2018

(65) Prior Publication Data

US 2018/0233537 A1 Aug. 16, 2018

Related U.S. Application Data

(60) Provisional application No. 62/458,346, filed on Feb. 13, 2017.

(51) Int. Cl.
| | |
|---|---|
| *G09G 3/32* | (2016.01) |
| *G09G 3/3208* | (2016.01) |
| *G09G 3/3225* | (2016.01) |
| *H01L 27/15* | (2006.01) |
| *H01L 33/06* | (2010.01) |
| *H01L 33/62* | (2010.01) |
| *H01L 51/52* | (2006.01) |

(Continued)

(52) U.S. Cl.
CPC ............. *H01L 27/156* (2013.01); *G09G 3/32* (2013.01); *G09G 3/3208* (2013.01); *G09G 3/3225* (2013.01); *H01L 33/06* (2013.01); *H01L 33/62* (2013.01); *H01L 51/5271* (2013.01); *H01L 51/56* (2013.01); *G09G 2300/0426* (2013.01); *G09G 2300/0452* (2013.01); *G09G 2320/0242* (2013.01); *G09G 2330/021* (2013.01); *H01L 25/167* (2013.01); *H01L 27/3211* (2013.01); *H01L 27/3255* (2013.01); *H01L 27/3276* (2013.01); *H01L 27/3288* (2013.01); *H01L 33/0079* (2013.01); *H01L 33/32* (2013.01); *H01L 33/42* (2013.01); *H01L 33/46* (2013.01); *H01L 33/504* (2013.01); *H01L 33/507* (2013.01); *H01L 51/5206* (2013.01); *H01L 51/5221* (2013.01); *H01L 2933/0016* (2013.01); *H01L 2933/0025* (2013.01); *H01L 2933/0066* (2013.01)

(58) Field of Classification Search
CPC ...... G09G 3/32; G09G 3/3208; G09G 3/3225; G09G 2300/0426; G09G 2300/0452; G09G 2320/0242; G09G 2330/021
See application file for complete search history.

(56) References Cited

U.S. PATENT DOCUMENTS

| | | |
|---|---|---|
| 8,525,424 B2 | 9/2013 | Li et al. |
| 8,557,616 B2 | 10/2013 | Lau et al. |

(Continued)

*Primary Examiner* — Ryan A Lubit
(74) *Attorney, Agent, or Firm* — Novick, Kim & Lee, PLLC; Allen Xue

(57) ABSTRACT

A monolithic Light Emitting Diode (LED) micro-display contains one or more modular LED arrays. The LED array uses quantum dot light conversion technology or Organic Light Emitting Diode (OLED). The micro-display has a spacing-saving topology and a direct current driver architecture. Its modular design is scalable, which allows manufacturing micro-displays of various sizes using the same module.

4 Claims, 16 Drawing Sheets

(51) Int. Cl.
  *H01L 51/56* (2006.01)
  *H01L 27/32* (2006.01)
  *H01L 33/00* (2010.01)
  *H01L 33/46* (2010.01)
  *H01L 33/32* (2010.01)
  *H01L 33/42* (2010.01)
  *H01L 33/50* (2010.01)
  *H01L 25/16* (2006.01)

(56) References Cited

U.S. PATENT DOCUMENTS

| | | |
|---|---|---|
| 8,963,810 B2 | 2/2015 | Li et al. |
| 8,963,811 B2 | 2/2015 | Li et al. |
| 9,047,810 B2 | 6/2015 | Li et al. |
| 9,058,762 B2 | 6/2015 | Li et al. |
| 9,089,027 B2 | 7/2015 | Li et al. |
| 9,280,928 B2 | 3/2016 | Li et al. |
| 9,286,825 B2 | 3/2016 | Li et al. |
| 9,336,704 B2 | 5/2016 | Li et al. |
| 9,390,647 B2 | 7/2016 | Li et al. |
| 9,485,827 B2 | 11/2016 | Li et al. |
| 9,671,609 B2 | 6/2017 | Li et al. |
| 9,698,134 B2 | 7/2017 | Li et al. |
| 9,704,430 B2 | 7/2017 | Li et al. |
| 9,716,085 B2 | 7/2017 | Li et al. |
| 9,747,872 B2 | 8/2017 | Li et al. |
| 9,812,059 B2 | 11/2017 | Li et al. |
| 9,818,337 B2 | 11/2017 | Li et al. |
| 9,955,542 B2 | 4/2018 | Li et al. |
| 2008/0042939 A1* | 2/2008 | Yamashita ............ G09G 3/3233 345/76 |
| 2011/0163941 A1 | 7/2011 | Li et al. |
| 2012/0327129 A1* | 12/2012 | Li ............................ G09G 5/10 345/690 |
| 2015/0109190 A1* | 4/2015 | Li ........................ G09G 3/3426 345/82 |
| 2018/0174504 A1* | 6/2018 | Yoneoka ................. G09G 3/32 |

* cited by examiner

INTEGRATED MULTILAYER MONOLITHIC ASSEMBLY LED DISPLAYS AND METHOD OF MAKING THEREOF

RELATED APPLICATION

This application claims the benefit of priority under 35 U.S.C. § 119 to U.S. Provisional Application No. 62/458,346, filed on Feb. 13, 2017, the entire contents of which are incorporated herein by reference.

TECHNICAL FIELD

The present disclosure relates to monolithic light-emitting diode (LED) displays and method of manufacturing thereof, more particularly to the monolithic LED micro-display employing direct, constant current drivers.

RELATED ART

LED displays are used in various applications ranging from outdoor large display panels to micro-displays for hand-held display devices. While large display panels may employ arrays of discreet LEDs, micro-display often uses monolithic LED arrays to meet the requirement for small display sizes and fine pixel pitches. U.S. Pat. No. 8,557,616 discloses methods of making a micro-display mounted on an active matrix panel. However, the turn-on voltages of LEDs on an active matrix vary according to the distance between each LED and n-electrode, which leads to variations in the lifetime and emitting wavelength of individual LEDs in the micro-display. There is a need for micro-LED displays that has a uniform color purity, good durability, and high power efficiency.

SUMMARY

The microdisplay of this disclosure employs one or more array of quantum dot LEDs or organic LEDs with spacing-saving topology and direct current driver architecture, delivering high video brightness dynamics and power efficiency. Its modular design also allows manufacturing different size displays using the same module.

The LEDs in an array may be arranged in a common anode scan configuration, in which anodes of a plurality of LEDs of a same color in a same row are operatively connected to a power source via a switch while cathodes of the plurality of LEDs of the same color in a same column are tied to the output of a current driver circuit. As such, the LEDs have a same supply voltage. In such a configuration, an NMOS driver is often used as the current sink. An NMOS is preferable over a PMOS because NMOS has a larger current capacity and a lower Rds(on) for a given design geometry.

Alternatively, the LED display may use a common cathode topology, in which cathodes of a plurality of LEDs of a same color in a same row are connected to a scan switch (i.e., a scan line) and the anodes of a plurality of LEDs of a same color in a same column are connected to a driver circuit via a common anode bus.

One embodiment of the LED panel of the current disclosure has a first layer comprising an LED array having rows and columns of interconnected LED pixels, a second layer comprising a plurality of driver circuits, and a plurality of cathode buses and a plurality of anode buses disposed between the first layer and the second layer. Each driver circuit is connected to a power source and comprises an on-off switch. Each LED pixels have a red LED, a green LED, and a blue LED, and each LED has a cathode and an anode. Each of the plurality of driver circuits outputs a constant current to one of the plurality of cathode buses or to one of the plurality of anode buses.

In a further embodiment of a common cathode configuration, each anode bus connects anodes of LEDs of a same color in a column while each cathode bus connects cathodes of the red LEDs, the green LEDs, and the blue LEDs in a row. Each anode bus receives a constant current outputted from the driver circuit and each cathode bus is connected to the on-off switch in the driver circuit.

In still an embodiment of a common anode configuration, each anode bus connects anodes of the red LEDs, the green LEDs, and the blue LEDs in a row while each cathode bus connects cathodes of LEDs of a same color in a column. Each cathode bus receives a constant current outputted from the driver circuit and each anode bus is connected to the on-off switch in the driver circuit.

In some embodiments, the driver circuit includes a phase lock loop, a plurality of pulse width modulation engines, a configuration register, a plurality of gain adjustable fast charge current sources, and a serial input/output interface. The phase lock loop is operatively connected to the serial input/output interface and provides a global clock signal. The plurality of pulse width modulation (PWM) engines is operatively connected to the serial input/output interface, they receive gray scale values from the serial input/output interface, they also receive a global clock signal from the phase lock loop. The PWM engines generate PWM signals for the plurality of gain adjustable fast charge current sources. The configuration register is operatively connected to the serial input/output interface and the gain adjustable fast charge current source. It stores driver circuit settings.

The plurality of gain adjustable fast charge current sources are operatively connected to the configuration register, the serial input/output interface, and the plurality of PWM engines. These current sources provide a plurality of current outputs, where each current output is operatively connected to a common anode bus in the LED array. The serial input/output interface is operatively connected to the phase locked loop, the configuration register, the PWM engines, and the gain adjustable fast charge current sources. Such a serial input/output interface provides driver circuit settings to the configuration register. It also provides gray scale values to the pulse width modulation engines, and in addition, it provides global gain adjustment settings to the gain adjustable fast charge current sources. As such, controlled by the PWM engine, the driver circuit outputs a constant driving current.

This disclosure also provides methods for manufacturing a monolithic LED array. In one of the methods, a plurality of overlying layers are built on a first substrate in the order of a cathode material layer, a multi-quantum well material layer, and an anode material layer. The cathode material layer is in contact with the first substrate. These overlying layers cooperate to emit light when activated. An insulating layer, e.g., ITO, is then applied on the plurality of overlying layers. The plurality of overlaying layers of material are patterned to form LED islands on the cathode material layer. A cathode metal is deposited on the cathode material layer and a template substrate is bonded on top of the LED islands and the cathode metal. The first substrate is then lift off from the cathode material layer and exposes a surface of the cathode material layer opposed to the LED islands. Isolated areas of red, green, or blue quantum dot materials are formed on the surface of the cathode material layer opposed to the LED islands. Each of the areas is aligned with one of the LED islands. Subsequently, a layer of distributed Bragg reflector is applied on the areas of red, green, and blue quantum dot materials. A transparent substrate (e.g., glass, sapphire) is attached to the layer of distributed Bragg reflector. Further, the template substrate is removed, exposing the LED islands. Finally, a P-electrode pad is formed on each of the LED islands.

The LED array fabricated using this method is suitable to be used in the common cathode configuration. The cathode material serves as the common cathode bus.

In another method of this disclosure, a plurality of overlying layers are deposited on the first substrate in the order of a cathode material layer, a multi-quantum well material layer, and an anode material layer. The cathode material layer is in contact with the first substrate. The plurality of overlying layers cooperating to emit light when activated. An insulating layer is then applied on the plurality of overlying layers. On the other hand, a transparent substrate having a layer of distributed Bragg reflector is prepared. A quantum dot material layer comprising isolated areas of a red quantum dot material, or a green quantum dot material is then arranged, e.g., by bonding using an adhesive, between the distributed Bragg reflector and the insulating layer. The first substrate is then from the cathode material layer, exposing the cathode material layer. The plurality of overlaying layers of material are patterned to form LED islands on the insulating layer. Each of the LED islands is aligned with a quantum material area across the insulating layer. An anode metal is then deposited on the insulating layer.

The LED array fabricated using this method is suitable to be used in the common anode configuration. The anode material serves as the common anode bus.

BRIEF DESCRIPTION OF THE DRAWINGS

The teachings of the present invention can be readily understood by considering the following detailed description in conjunction with the accompanying drawings.

DETAILED DESCRIPTION

Figure 1:
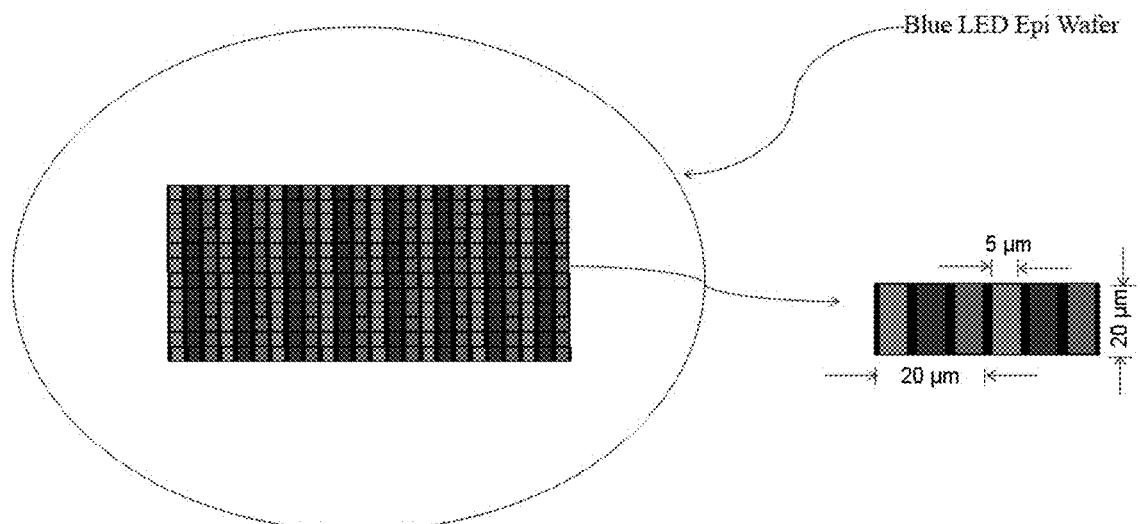
FIG. 1 is a top view of monolithic LED array.

Reference will now be made in detail to embodiments of the present disclosure, examples of which are illustrated in the accompanying drawings. It is noted that wherever practicable, similar or like reference numbers may be used in the drawings and may indicate similar or like elements.

The drawings depict embodiments of the present disclosure for purposes of illustration only. One skilled in the art would readily recognize from the following description that alternative embodiments exist without departing from the general principles of the present disclosure.

Figure 2:
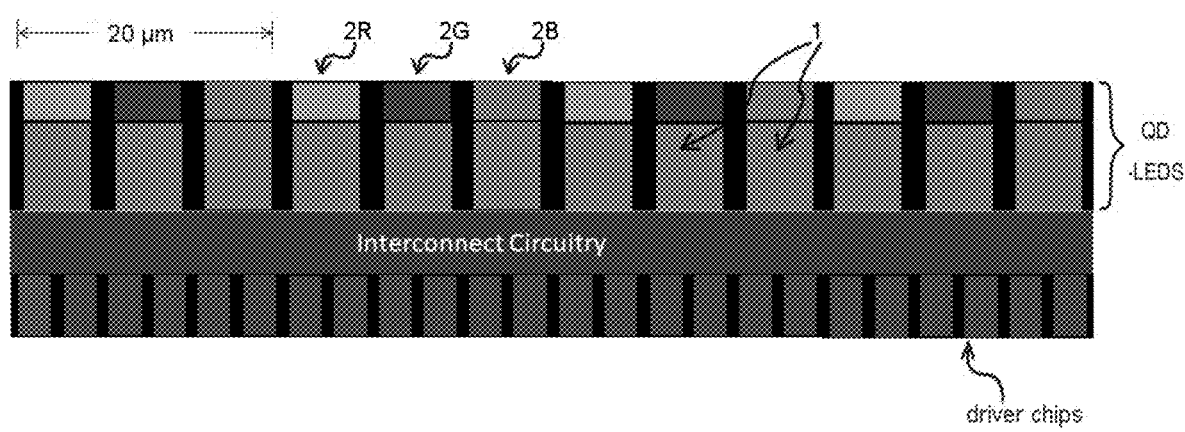
FIG. 2 is a side view of a device having a monolithic LED array.

FIG. 1 is a top view of monolithic assembly LED array of the current disclosure. FIG. 2 is a schematic illustration of a side view of an exemplary device containing a QD-LED array of FIG. 1. In this embodiment, an array of blue LED (1) is manufactured on an epitaxial wafer. The epitaxial wafer is 100 mm in diameter. Quantum dot materials (2R, 2G, and 2B) that respectively cause the emission of red, green, and blue lights are applied on the top surface of the blue LEDs to form quantum dot LEDs, i.e., QD-LEDs. The QD-LEDs are arranged in a manner that forms rows and columns of QD-LED units, which in turn forms a QD-LED array. Each QD-LED unit (i.e., pixel) has a red, a green, and a blue QD-LED, collectively QD-LEDs. In the exemplary embodiment in FIG. 1, each pixel is of 20 microns by 20 microns in size. Each of QD-LED in the pixel has a size of 20 microns in length and 5 microns in width. The quantum dot material contains quantum dot particles in the nanometer range and a host material such as photoresist, epoxy, or silicone, etc. The size of the quantum dot particles is tailored so that these particles produce the desired color spectrum when excited by the blue LED emission.

The QD-LED array can be processed to form electronic devices. FIG. 2 shows the QD-LED array mounted on a plurality of driver chips via an intermediate layer containing the interconnect circuitry. The interconnect circuitry connects the QD-LED array with the array driver chips. The driver chip contains one or more driver circuits.

Details of the driver circuit is not shown. However, in some embodiments, the driver circuit includes a phase lock loop, a plurality of pulse width modulation engines, a configuration register, a plurality of gain adjustable fast charge current sources, and a serial input/output interface. The phase lock loop is operatively connected to the serial input/output interface and provides a global clock signal. The plurality of pulse width modulation (PWM) engines is operatively connected to the serial input/output interface, they receive gray scale values from the serial input/output interface as well as a global clock signal from the phase lock loop. The PWM engines generate PWM signals for the plurality of gain adjustable fast charge current sources. The configuration register stores driver circuit settings and is operatively connected to the serial input/output interface and the gain adjustable fast charge current source.

The plurality of gain adjustable fast charge current sources are operatively connected to the configuration register, the serial input/output interface, and the plurality of PWM engines. These current sources provide a plurality of current outputs, where each current output is operatively connected to a common anode bus in the LED array. The serial input/output interface is operatively connected to the phase locked loop, the configuration register, the PWM engines, and the gain adjustable fast charge current sources. This serial input/output interface provides driver circuit settings to the configuration register. It also provides gray scale values to the pulse width modulation engines, and in addition, it provides global gain adjustment settings to the gain adjustable fast charge current sources. Accordingly, controlled by the PWM engine, the driver circuit outputs a constant driving current that drives the QD-LED array.

Figure 3:
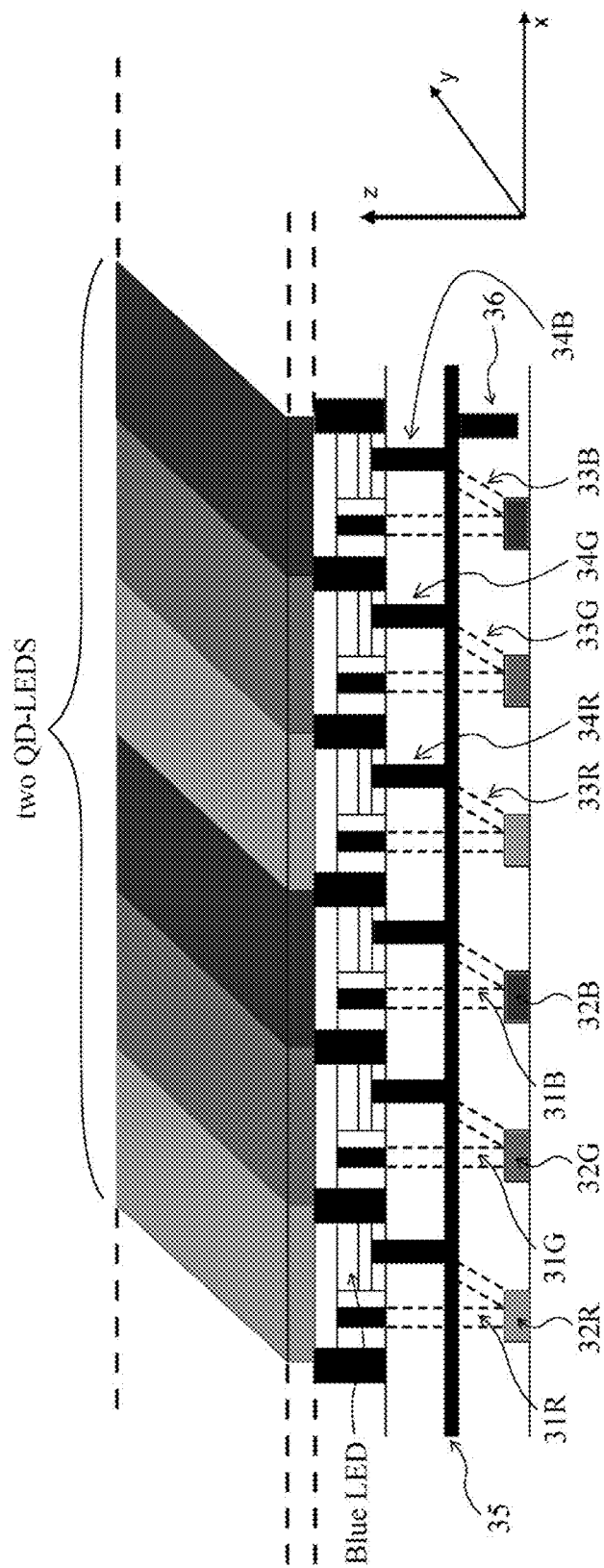
FIG. 3 provides another view of the device in FIG. 2.

FIG. 3 provides further details of the QD-LED array and the intermediate layer containing the interconnect circuitry. FIG. 3 shows two QD-LED units in a same row arranged in the X-direction. Although not shown in FIG. 3, it is understood that rows of QD-LED units extend in the Y-direction to form the LED array. In the Z-direction, the QD materials are disposed on the top of the blue LEDs. Connection lines (31R, 31G, or 31B) from the anodes of the QD-LEDs extend downward in the Z-direction and are connected to red, green, or blue bonding pads (32R, 32G, or 32B), collectively anode bonding pads. The anode bonding pads for LEDs of the same color in different rows are connected to a common anode bus (33R, 33G, or 33B), which extends in the Y-direction under the LED array. On the other hand, cathodes of QD-LEDs in a same row are connected via lines (34R, 34G, or 34B) to a common cathode bus (35) extending in the X-direction, i.e., a scan line. Each row has its own corresponding scan line. Accordingly, the intermediate layer contains a plurality of scan lines arranged in parallel in the Y-direction and a plurality of parallel common cathode buses arranged in parallel in the X-direction. The plurality of scan lines may reside in a same depth relative to each other, i.e., the first depth. The plurality of common cathode buses may be in another same depth relative to each other, i.e., the second depth. But the first depth and the second depth are not the same.

Further, each scan line is connected to a scan bonding pad (not shown) via a through hole in the intermediate layer (36). The anode bonding pads and the scan bonding pads are connected to the driver chip (not shown). The QD-LED array and the intermediate layer may be manufactured on a same wafer using known photolithographic methods. The driver chips may also be fabricated on a wafer, e.g., a Si driver wafer, which is bonded to the intermediate layer at corresponding bonding pads. The bonding process can be done by semiconductor wafer bonder with the proper placement precision.

Figure 4:
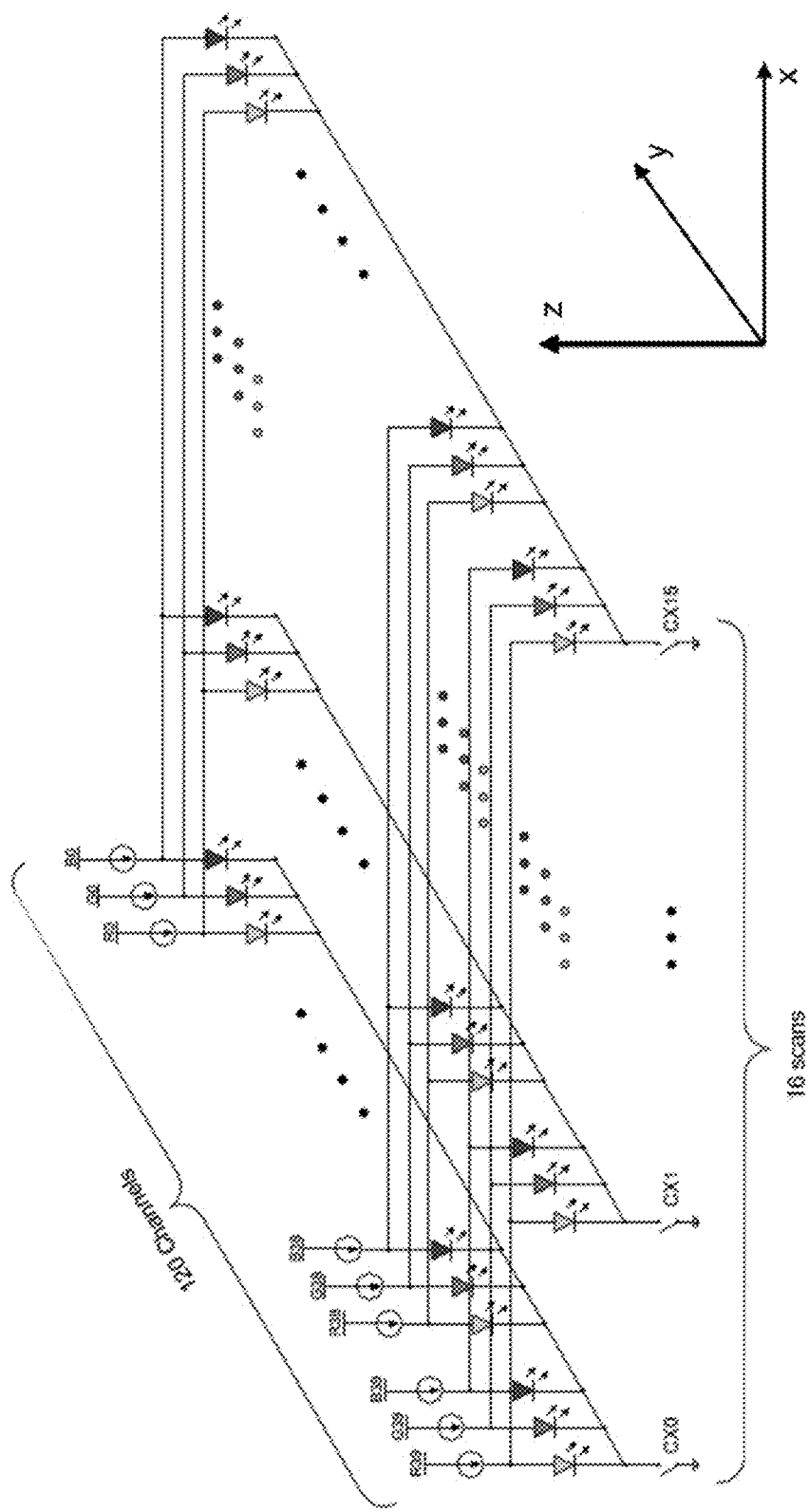
FIG. 4 shows interconnections amongst LEDs in the monolithic LED array.

FIG. 4 is another depiction of the interconnections amongst the LEDs in the QD-LED array of 16×120 LEDs. In this case, the array has 16 rows and 120 channels. Each row has 40 QD-LED pixels. Cathodes of that 40 QD-LED pixels in a row are connected to one of the 16 scan lines that corresponds to that row. Each scan line is also connected to a corresponding on-off scan switch, i.e., one of CX0 to CX15. Each channel connects anodes of 16 QD-LEDs with one of the 120 constant current sources (i.e., one of R0, G0, B0 . . . R39, G39, and B39). The scan line corresponds to the scan line (35) in FIG. 3 while each channel corresponds to a common anode bus (33R, 33G, or 33B). The constant current sources as well as the switches in FIG. 4 may be installed on the driver chip.

The QD-LED array in FIG. 4 can be operated at 16 scan rate. This configuration is referred to as "common cathode." Alternatively, the array can be connected in a "common anode" configuration, in which anodes of 120 diodes in 40 pixels in a same row are connected to a scan switch while the cathodes of 16 diodes of the same color in a same column are connected to a power source.

In other embodiments of the current disclosure, the LED array may use organic LED (OLED) instead of QD-LEDs. In such cases, each QD-LED in the QD-LED array shown in FIGS. 1-4 is replaced by an OLED of the same color. The interconnections amongst the OLEDs and between the OLED array with the driver chip remain the same.

Figure 5:
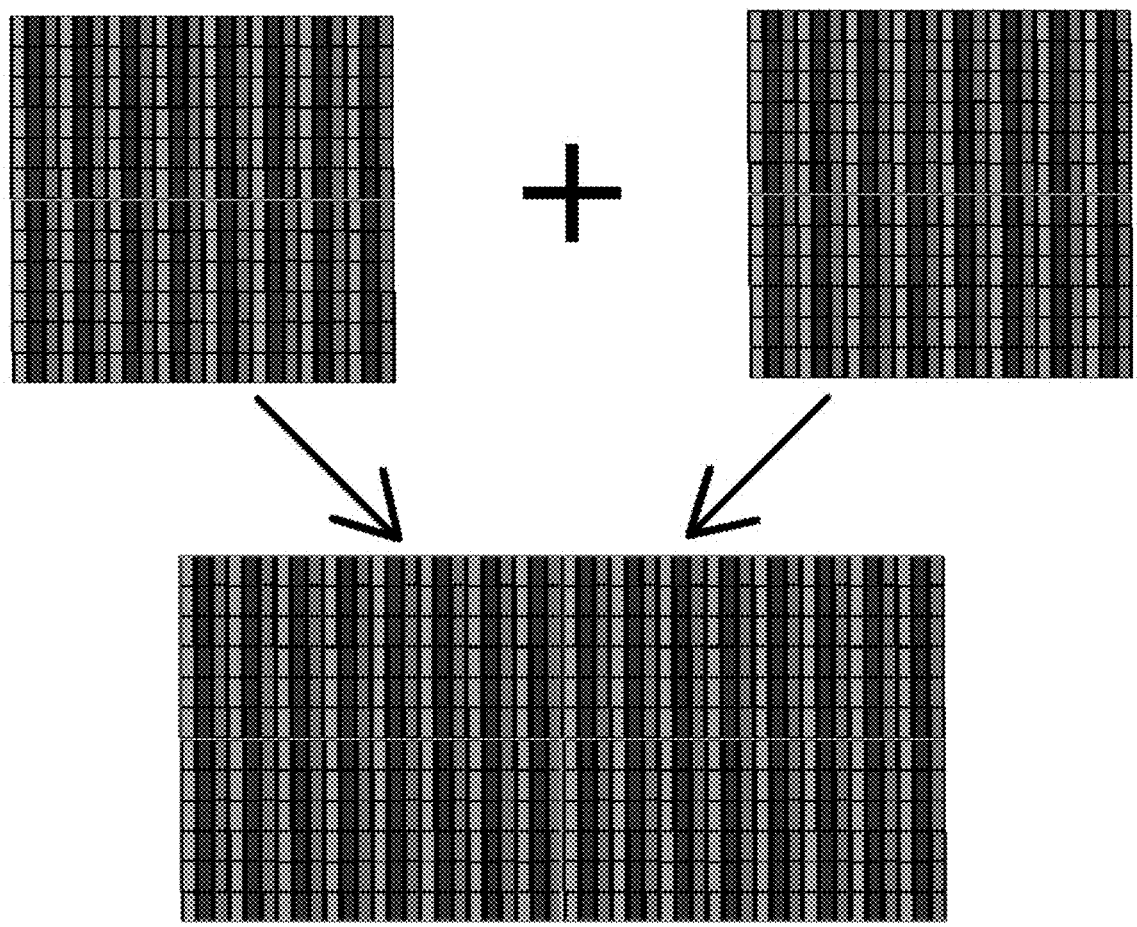
FIG. 5 illustrates an assembly containing two monolithic LED arrays.

One aspect of the current disclosure is that the LED micro-display is made by combining multiple LED modules. For example, a 4K micro-display with 3840×2160 pixels can be constructed using two LED modules of 1920×2160 pixels each, as shown in FIG. 5.

The size of LED module is primarily determined by practical manufacturing limitations for high yield processes, including wafer size of LED, OLED, driver wafer and pixel yields. Since the LED or OLED wafers are different from Si driver wafer in these aspects, the size of a basic LED or OLED module may differ from that of the driver chip module.

For example, an LED module of about 40 mm by 40 mm has 1920×2160 pixels of 20 micron pitch size. A driver chip (e.g., a Si driver module) of about 4 mm by 20 mm in size can drive 192×1080 pixels so that about 10 driver chips may drive 1920×1080 pixels and a 4 K micro-display requires 20 such driver chips.

Figure 6:
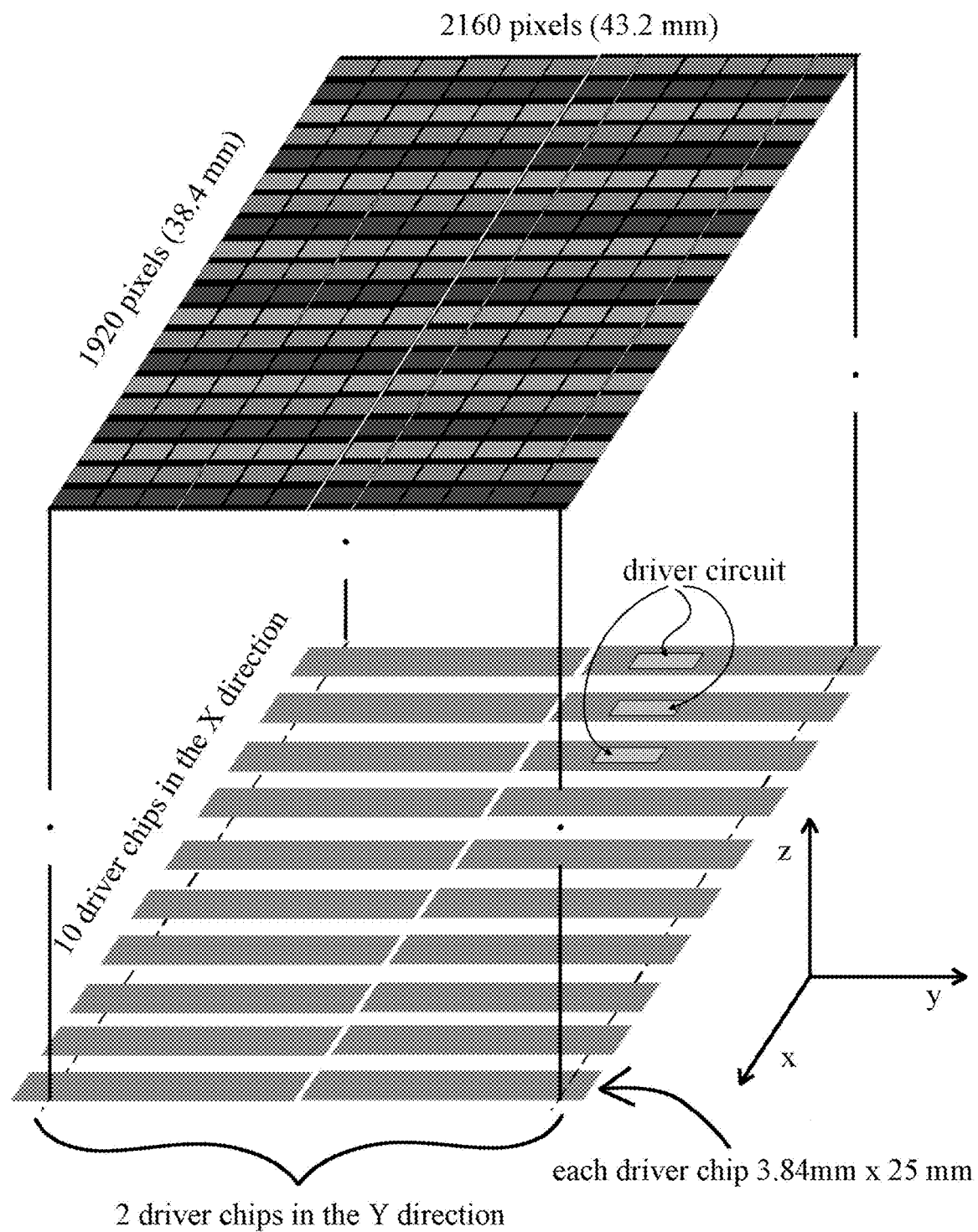
FIG. 6 illustrates a combination of two monolithic LED arrays and the corresponding driver chips.

FIG. 6 depicts a 1920×2160 LED module and its corresponding 20 Si driver chips with exemplary dimensions. Note that the Si driver chips are layered side-by-side in a 10×2 format, having a foot print of 38.4 mm by 50 mm. The LED module of 38.4 mm by 43.2 mm in size are disposed on the Si driver chips via the interconnect circuitry. Each Si driver chip is bond to the LED module. The method of bonding can be by metal bonding using Sn, AuSn, SnPb, etc. or by ACF/ACP processes. The peripheral portion of the driver chip is not covered by the LED module to accommodate the external connections to the driver circuitry.

Figure 7:
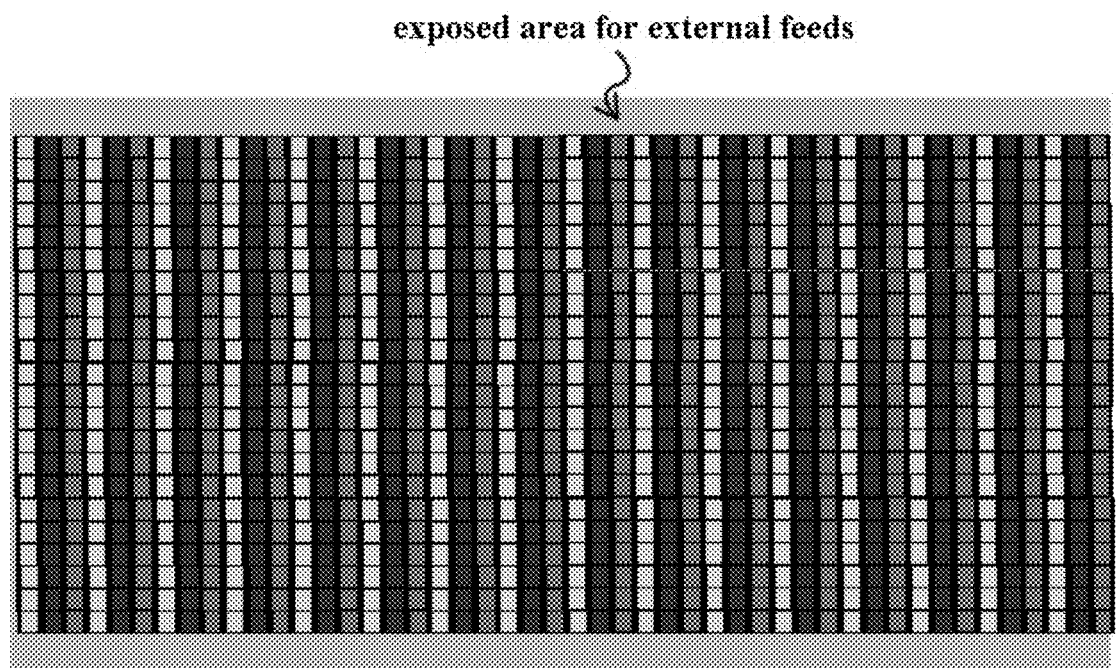
FIG. 7 is a schematic view of the LED arrays mounted on driver chips.

FIG. 7 shows an assembly having two LED modules and their associated Si driver chips that forms a 4 K micro-display of 76.8 mm by 43.2 mm. Edges of the Si driver chips extending out under the boundary of the LED modules are used for external content feeds, power connections, etc.

Figure 8:
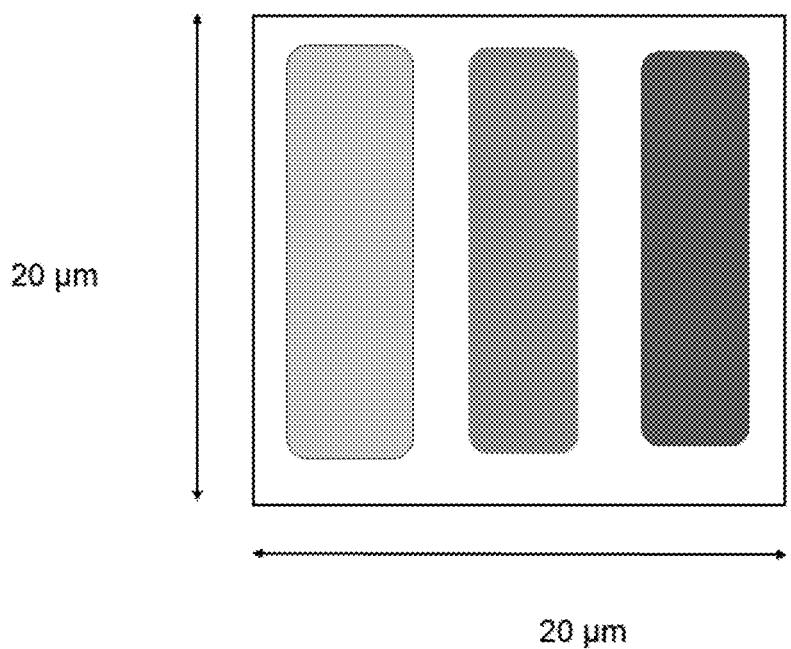
FIG. 8 is a schematic illustration of a monolithic LED pixel.

FIG. 8 is a top view of an exemplary layout of an LED pixel, which is similar to the insert in FIG. 1 (FIG. 1 showing two QD-LED pixels). Note that LED pixels can be used in either the common cathode configuration or the common anode configuration.

Figure 9:
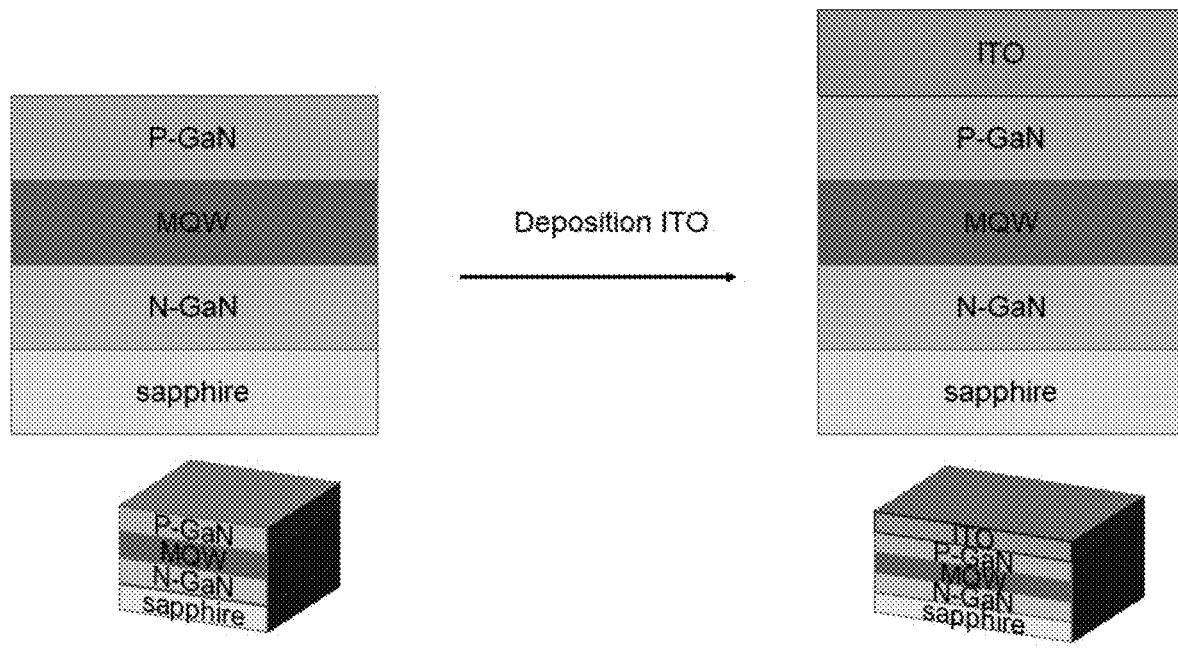
FIGS. 9-17 illustrate a method of making a monolithic LED pixel of the current disclosure.

FIGS. 9-17 illustrate steps in making an exemplary common cathode LED chip of the current disclosure. As shown in FIG. 9, an insulating layer, i.e., Indium-Tin Oxide (ITO) layer, is deposited on the P-GaN region of a GaN device having a multi-quantum-well (MQW) layer between the N-GaN region and the P-GaN region. The N-GaN region resides on a sapphire substrate. The substrate can also be made of GaAs, SiC, semi-insulating GaAs, and quartz.

Figure 10:
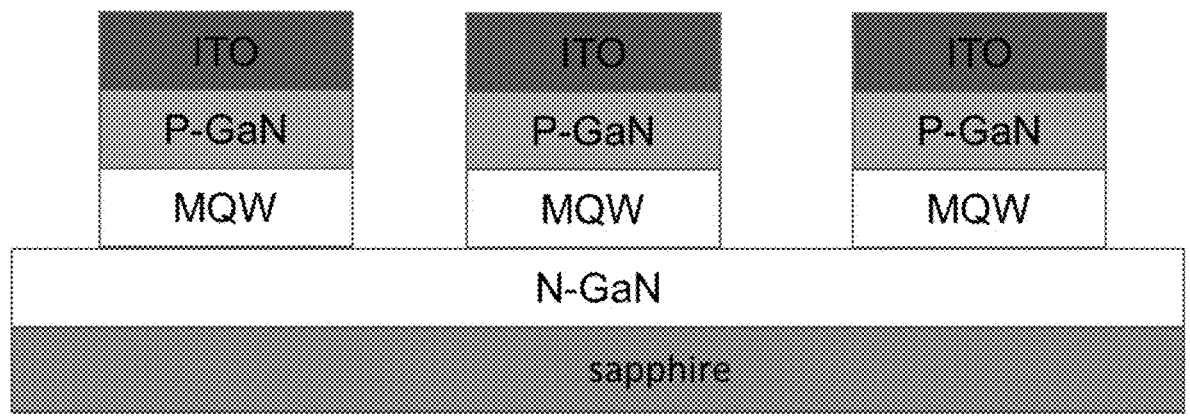
Figure 11:
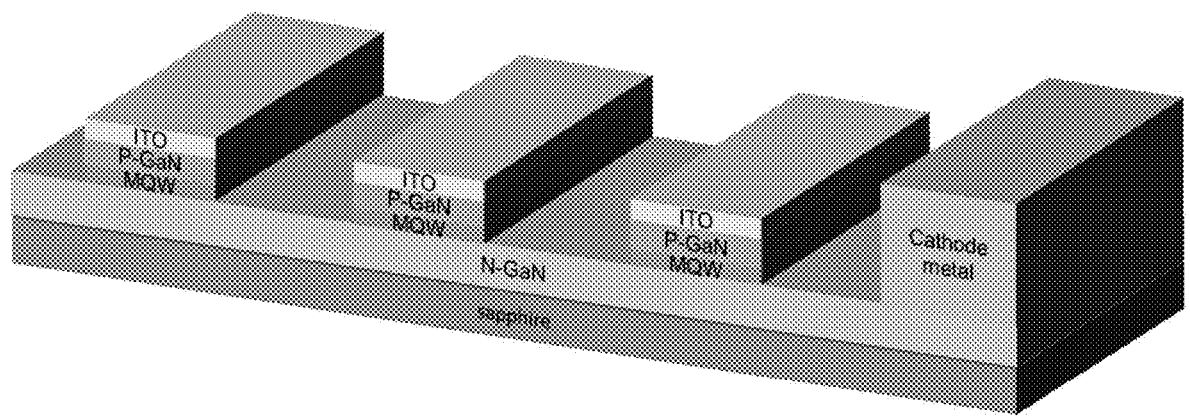
Figure 12:
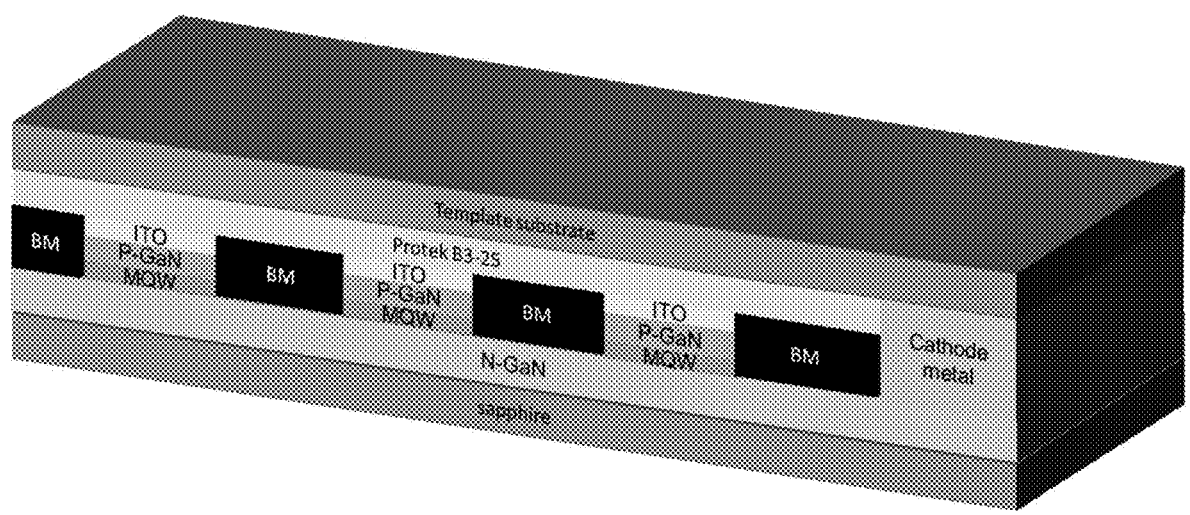

Subsequently, photolithographic process (e.g., itching) is used to create islands of ITO/P-GaN/MQW on the N-GaN region (FIG. 10). The cathode metal is then deposited on the N-GaN region next to the ITO/P-GaN/MQW islands (FIG. 11). The gaps between the components on the N-GaN layer are filled with a black matrix material (BM) (FIG. 12). The black matrix material can be a photoresist that is opaque to the light generated by the LEDs or the regenerated light from the quantum dot materials, such as a black pigmented photoresist. The black matrix material prevents light leakage between regions during the lithography process.

Figure 13:
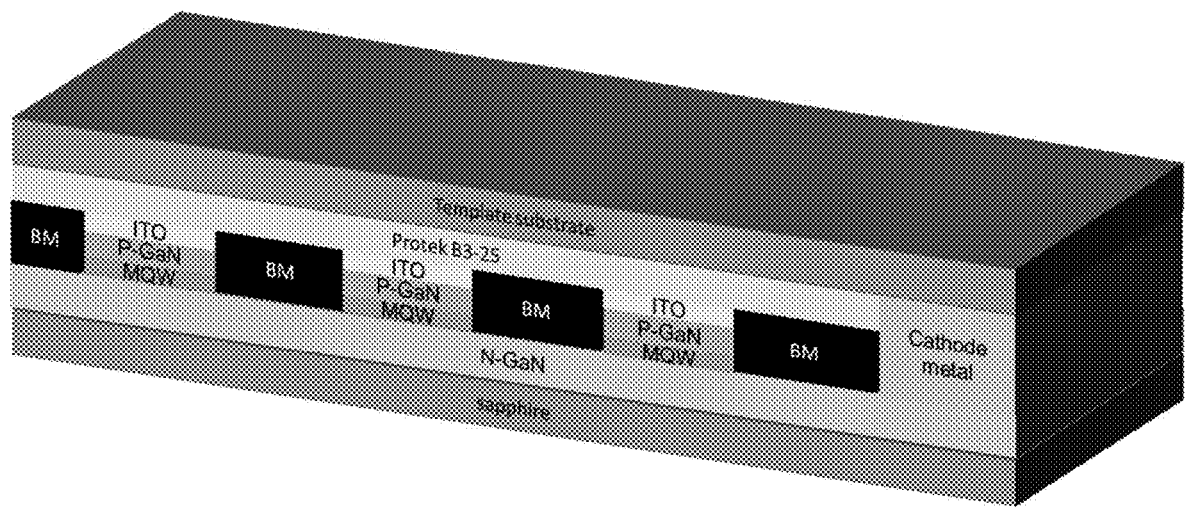
Figure 14:
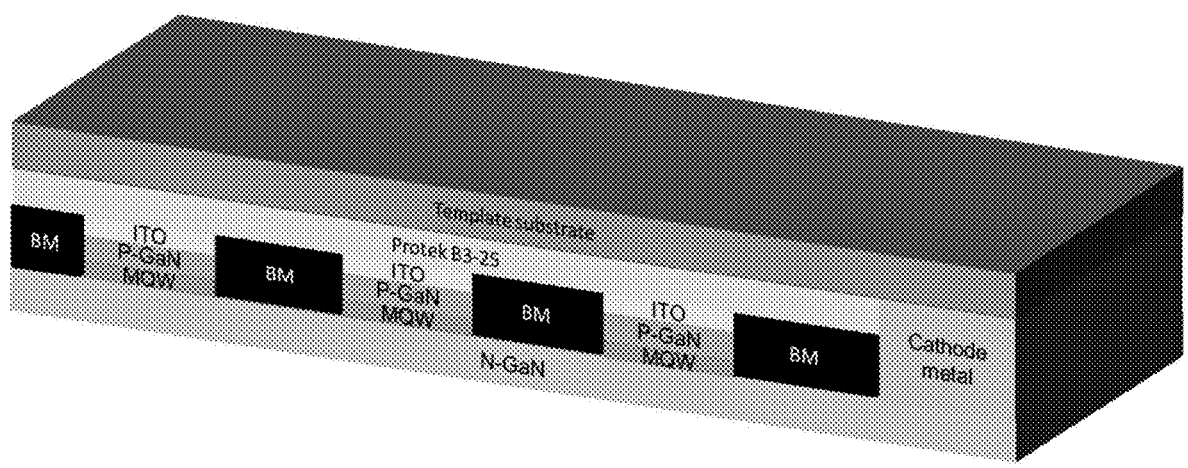
Figure 15:
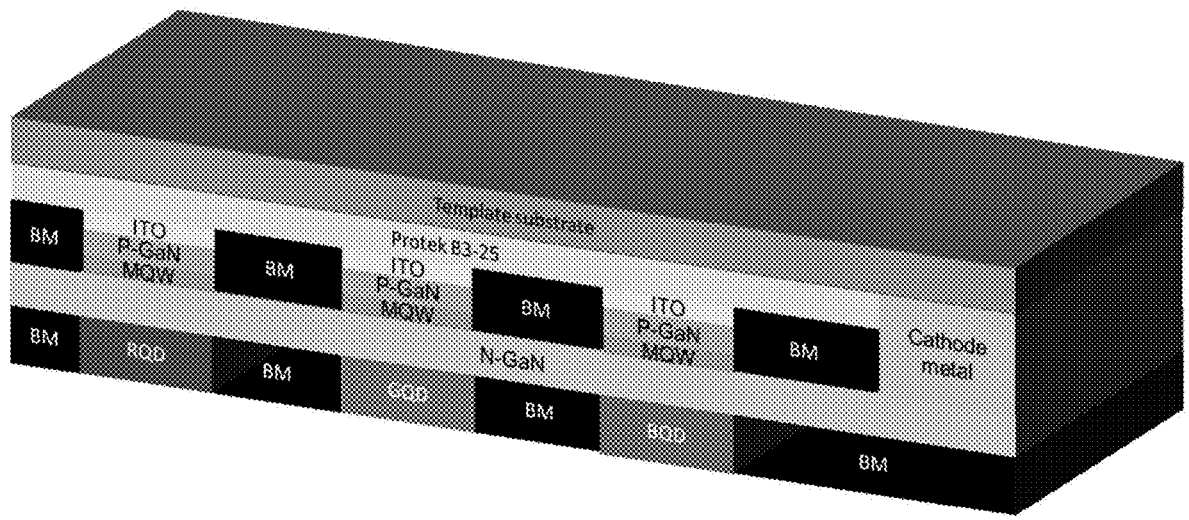

FIG. 13 shows bonding of a template substrate on top of the devices over an adhesive, the sapphire substrate being the bottom. Protek B3-25 is the adhesive chosen for its ease of removal of the template substrate in a subsequent step. The sapphire substrate is then removed, e.g., by laser lift-off, exposing the N-GaN region (FIG. 14). RGB quantum dot materials (RQD, GQD, or BQD) are applied to the N-GaN region in areas corresponding to the ITO/P-GaN/MQW islands. Gaps are created in the QD material layers and are filled with the black matrix material. The resulting device is shown in FIG. 15.

Figure 16:
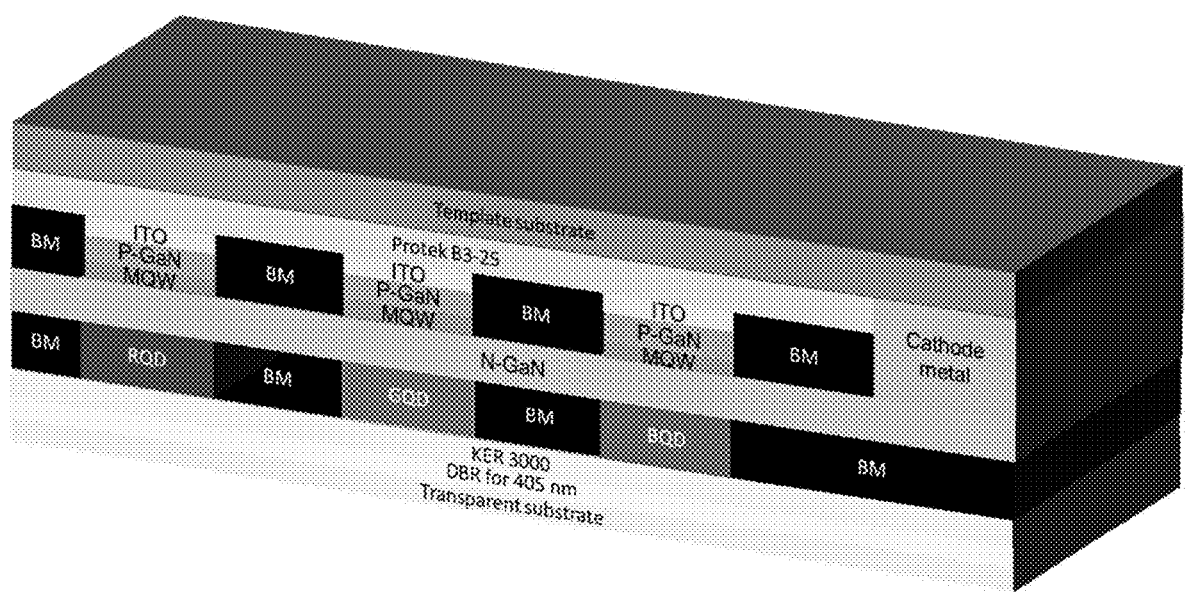
Figure 17:
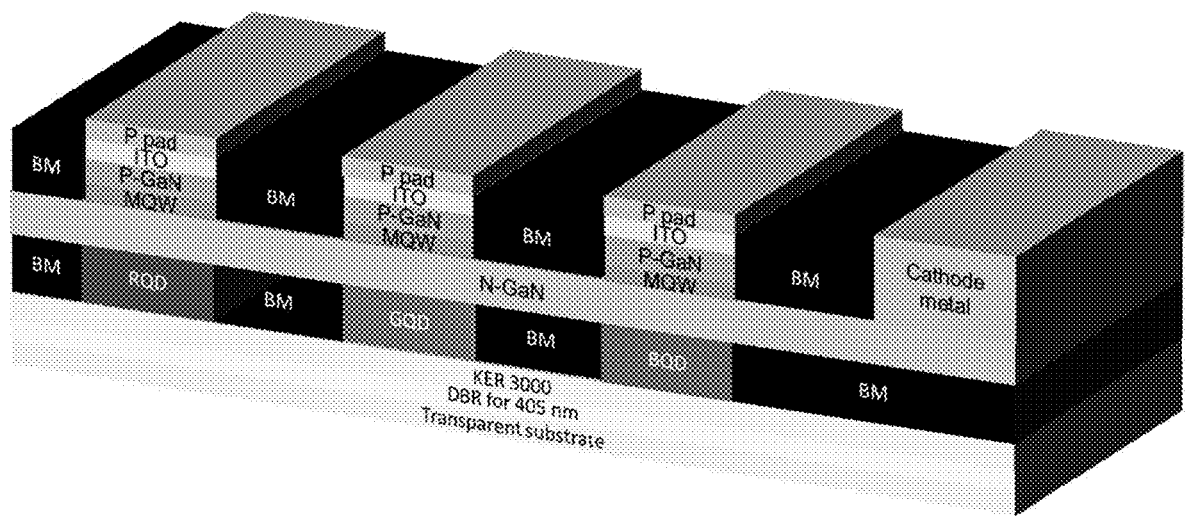

In order to block the 405 nm light, a distributed Bragg reflector (DBR) layer is attached to the quantum dot layer via an adhesive (FIG. 16). KER 3000 is chosen as a permanent adhesive for better thermal device performance. The template substrate and the adhesive on the ITO are then removed. P-electrode pads (i.e., P pad) are deposited on the ITO of ITO/P-GaN/MQW islands (FIG. 17), forming the common cathode LED chip.

The structure of FIG. 16 assumes that 405 nm light is used to excite the quantum dot materials so that the DBR is needed. Nevertheless, if blue lights such as 450-470 nm are used instead of 405 nm, the blue quantum dot is not needed. In such a case, the blue light from the LED passes the transparent window corresponding to the blue sub-pixel area and joins the red and green lights from the quantum dots for image display. A blue filter maybe needed in both green and red sub-pixels to filter out the pass-through blue light from the green and red quantum dot layers.

Figure 18:
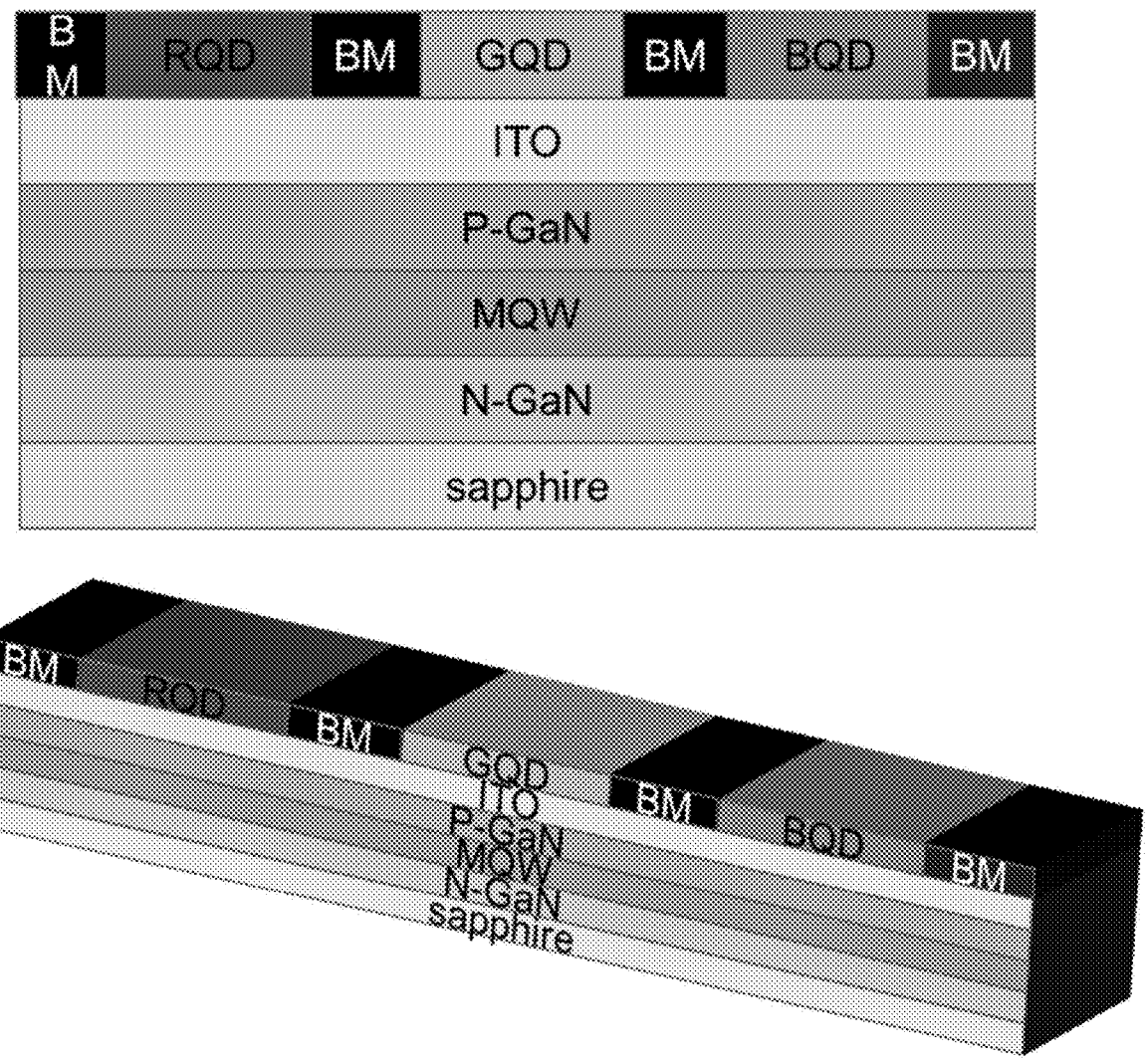
FIGS. 18-25 illustrate another method of making monolithic LED pixel of the current disclosure.
Figure 19:
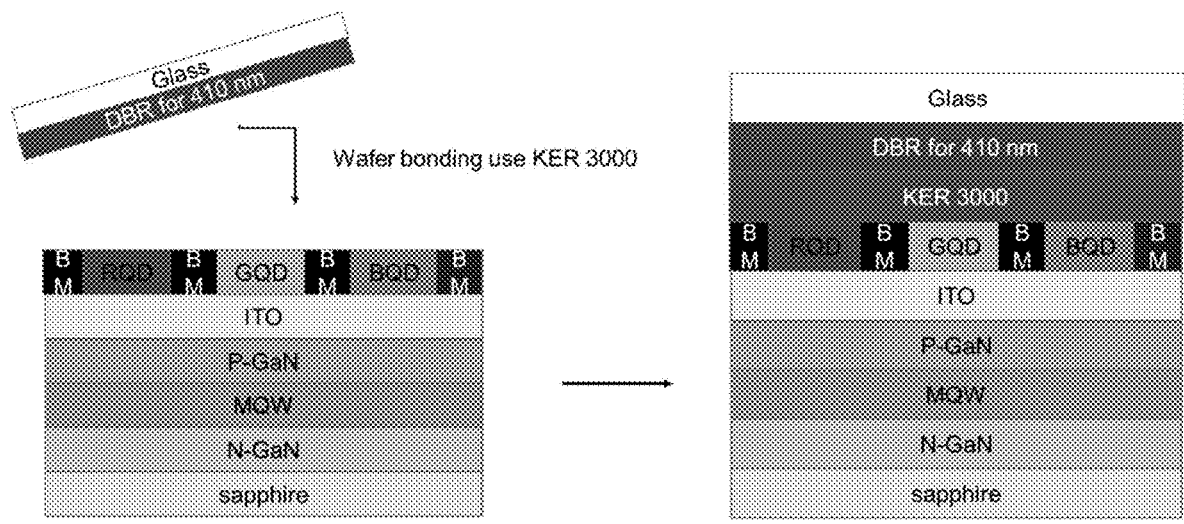
Figure 20:
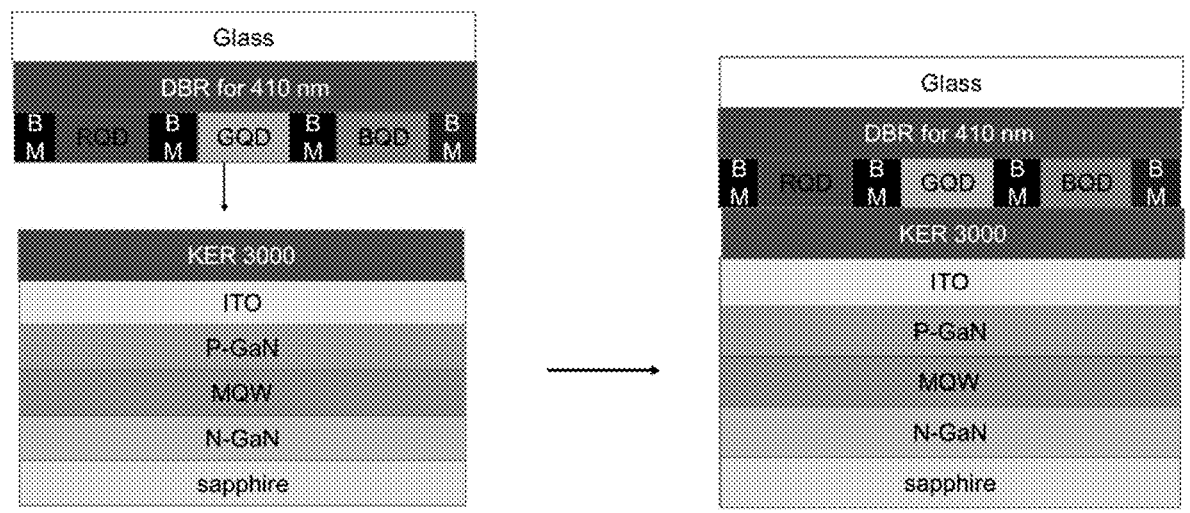
Figure 21:
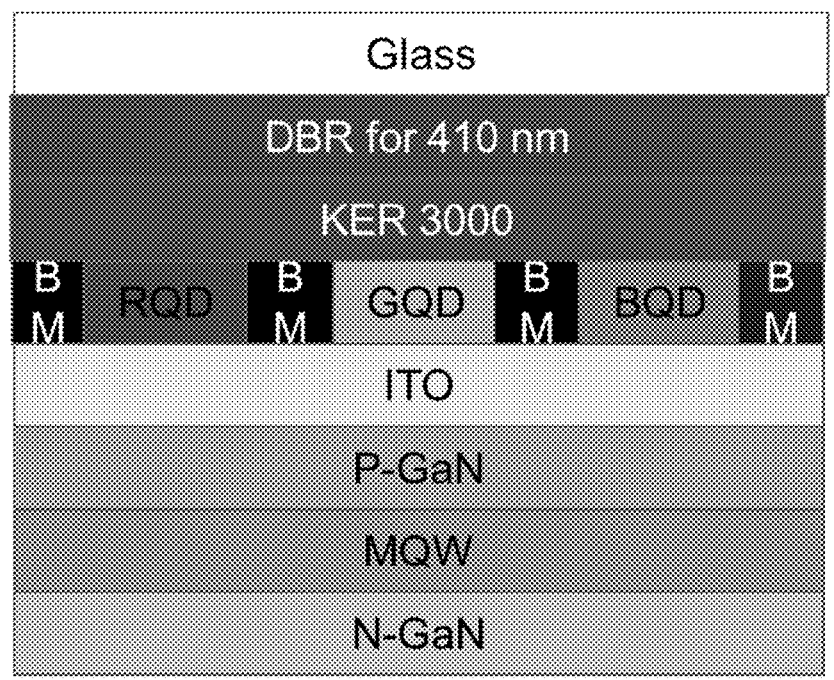
Figure 22:
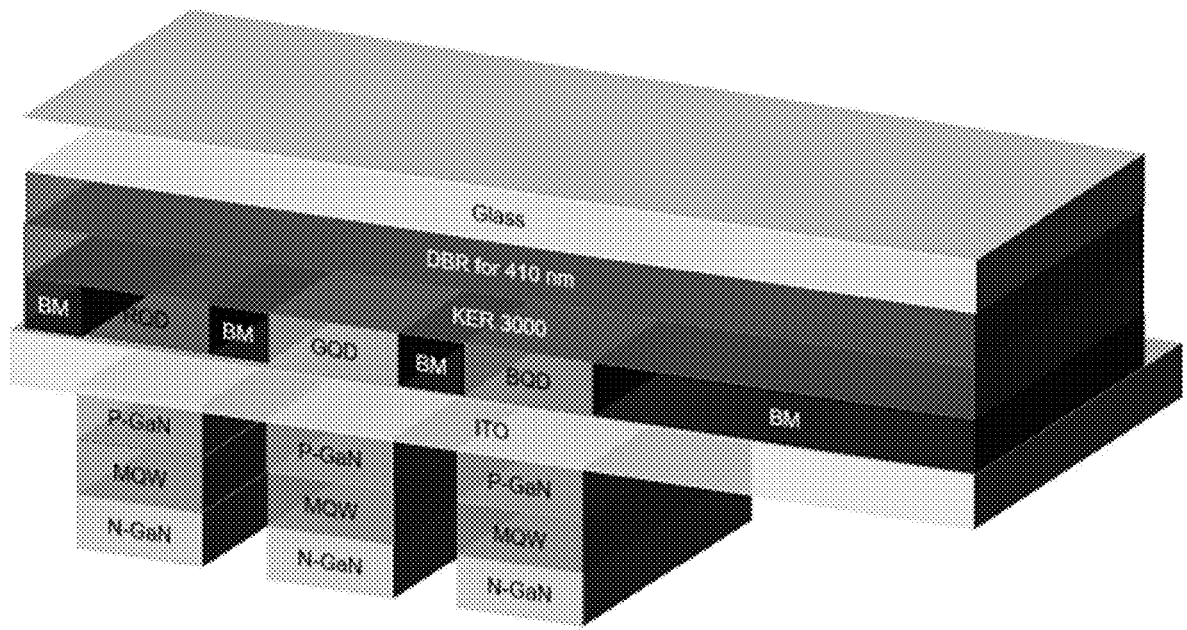

FIGS. 18-25 show steps for making exemplary LED pixels for the common anode configuration of the current disclosure. In making the common anode LED chip, quantum dot materials are applied on the ITO layer with black matrix separating red, blue, and green quantum dot materials, as shown in FIG. 18. The distributed Bragg reflector (e.g., for 410 nm) is then bonded to the quantum dot layer using an adhesive such as KER 3000 (FIG. 19). Alternative, the quantum dots can be deposited on the DBR reflector and then bond to the ITO (FIG. 20). Following the laser lift-off of the sapphire substrate (FIG. 21), islands of N-GaN/MQW/P-GaN are built on the ITO layer using known lithographic methods (FIG. 22).

Figure 23:
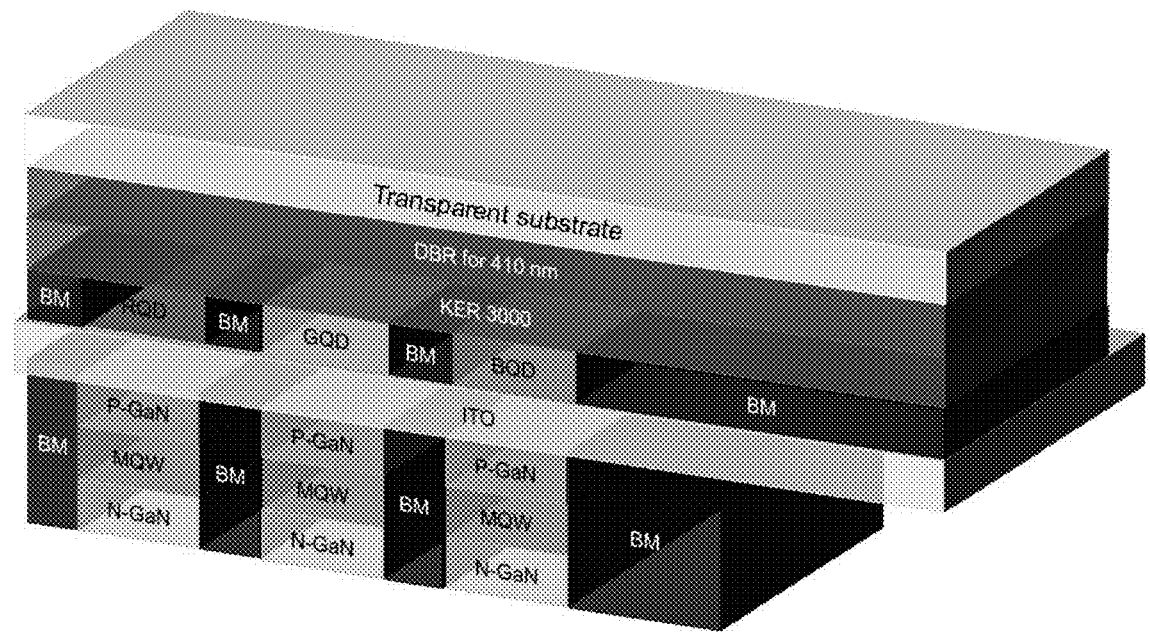
Figure 24:
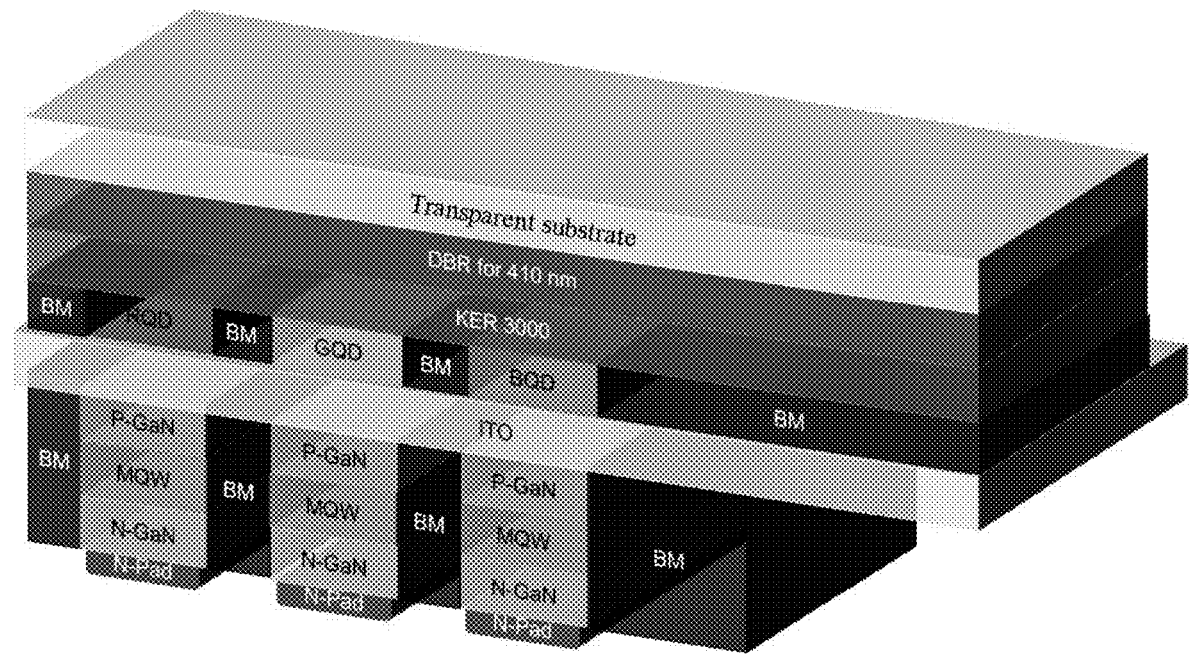
Figure 25:
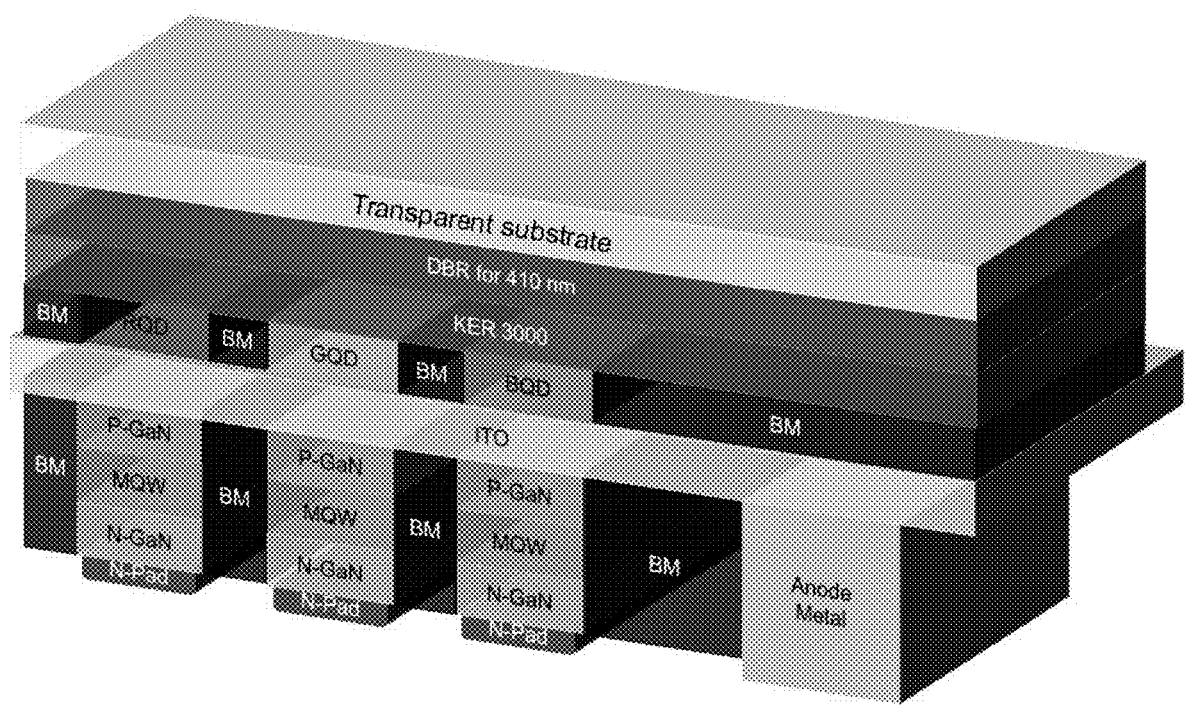

The islands are insulated from one another using the black matrix material (FIG. 23). Subsequently, N-electrode pads (N pads) are deposited on the islands (FIG. 24) and the anode metal is deposited on the ITO layer (FIG. 25). The LED pixels made using this method can be used in the common anode topology.

Embodiments of the present disclosure have been described in detail. Other embodiments will become apparent to those skilled in the art from consideration and practice of the present disclosure. Accordingly, it is intended that the specification and the drawings be considered as exemplary and explanatory only, with the true scope of the present disclosure being set forth in the following claims.

What is claimed is:

1. A monolithic light-emitting diode (LED) panel, comprising:
   a first layer comprising an LED array having rows and columns of interconnected LED pixels, each LED pixel has a red LED, a green LED, and a blue LED, and each LED has a cathode and an anode;
   a second layer comprising a plurality of driver circuits, each driver circuit is connected to a power source and comprises an on-off switch; and
   a plurality of cathode buses and a plurality of anode buses disposed between the first layer and the second layer,
   wherein each of the plurality of driver circuits outputs a constant current to one of the plurality of cathode buses or to one of the plurality of anode buses, and
   wherein the cathode of each LED is connected to one of the plurality of cathode buses and the anode of each LED is connected to one of the plurality of anode buses.

2. The monolithic LED panel of claim 1, wherein each anode bus connects anodes of LEDs of a same color in a column and each cathode bus connects cathodes of the red LEDs, the green LEDs, and the blue LEDs in a row, each anode bus receives a constant current outputted from the driver circuit, and each cathode bus is connected to the on-off switch in the driver circuit.

3. The monolithic LED panel of claim 1, wherein each anode bus connects anodes of the red LEDs, the green LEDs, and the blue LEDs in a row, each cathode bus connects cathodes of LEDs of a same color in a column, each cathode bus receives a constant current outputted from the driver circuit, and each anode bus is connected to the on-off switch in the driver circuit.

4. The monolithic LED panel of claim 1, wherein the red LED, the green LED, and the blue LED are quantum dot LEDs or organic LEDs.

* * * * *